(12) United States Patent
Nishibe et al.

(10) Patent No.: US 6,707,119 B2
(45) Date of Patent: Mar. 16, 2004

(54) POLYGONAL STRUCTURE SEMICONDUCTOR DEVICE

(75) Inventors: Eiji Nishibe, Oizumi-machi (JP);
Suichi Kikuchi, Oizumi-machi (JP);
Masaaki Momen, Ojiya (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/215,260

(22) Filed: Aug. 9, 2002

(65) Prior Publication Data

US 2003/0030113 A1 Feb. 13, 2003

(30) Foreign Application Priority Data

Aug. 9, 2001 (JP) ........................................ 2001-241901

(51) Int. Cl.[7] .............................................. H01L 29/76
(52) U.S. Cl. ........................ 257/401; 257/401; 257/351
(58) Field of Search ................................. 257/401, 351, 257/357, 409; 357/238, 23.11; 317/234; 217/308

(56) References Cited

U.S. PATENT DOCUMENTS

| | | | | |
|---|---|---|---|---|
| 4,639,762 A | * | 1/1987 | Neilson et al. | 357/23.8 |
| 4,684,967 A | * | 8/1987 | Taylor, Sr. et al. | 357/23.11 |
| 4,833,513 A | * | 5/1989 | Sasaki | 357/23.4 |
| 5,406,104 A | * | 4/1995 | Hirota et al. | 257/351 |
| 5,635,742 A | * | 6/1997 | Hoshi et al. | 257/337 |
| 5,838,050 A | * | 11/1998 | Ker et al. | 257/401 |
| 5,973,368 A | * | 10/1999 | Pearce et al. | 257/368 |

* cited by examiner

*Primary Examiner*—David Nelms
*Assistant Examiner*—Trinh T Nguyen
(74) *Attorney, Agent, or Firm*—Morrison & Foerster, LLP

(57) ABSTRACT

A die size is reduced in a semiconductor device having a gate electrode formed on a first gate insulation film and a second gate insulation film, source and drain regions (N− layers and N+ layers) formed adjacent to the gate electrode and a channel region, wherein the gate electrode, the channel region and the source and drain regions are hexagonal. Neighboring transistors are displaced from each other by a predetermined distance.

6 Claims, 2 Drawing Sheets

POLYGONAL STRUCTURE SEMICONDUCTOR DEVICE

BACKGROUND OF THE INVENTION

This invention relates to a semiconductor device, specifically to a semiconductor device minimizing a die size, while preventing a weak inversion current.

FIG. 3 and FIG. 4 are a cross-sectional view and a top view illustrating a prior art device.

A gate electrode 55 is disposed on a first gate insulation film 53 and a second gate insulation film 54, which is thicker than the first gate insulation film 53, formed in areas other than areas of a device isolation film 52 on a semiconductor substrate 51 of a first conductivity e.g. P-type, as shown in the figures.

Low impurity concentration N-type source and drain regions (N− layers, drift layers) 56 and 57 are disposed adjacent to the gate electrode 55 through the second gate insulation film 54.

High impurity concentration N-type source and drain regions (N+ layers) 58 and 59 are disposed between the second gate insulation film 54 and the device isolation film 52.

Together with a channel region 60, which is a surface region of the semiconductor substrate 51 between the source and drain regions 56 and 57 under the first gate insulation film 53, and a channel stopper layer 61 to prevent an inversion, the structure described above makes a so-called LOCOS offset-type semiconductor device.

A conventional transistor is basically shaped like a rectangle. It requires convex regions (shaded regions in FIG. 4) protruding from the N− layers 56 and 57 as shown in FIG. 4, in order to suppress a weak inversion leakage current.

When disposing a plurality of transistors in a die in the prior art, a width S2 of a pair of minimum transistors is increased by a width of the convex regions required to suppress the weak inversion leakage current.

SUMMARY OF THE INVENTION

A semiconductor device of this invention is directed to solve the problem addressed above. A gate electrode formed on a substrate of a first conductivity through a gate insulation film, source and drain regions of an opposite conductivity formed adjacent to the gate electrode and a channel region formed between the source and drain regions polygonal in shape. Neighboring transistors are provided such that they are displaced from each other by a predetermined distance.

The gate electrode, the source and drain regions and the channel region can also be hexagonal in shape.

Neighboring transistors are provided such that they are displaced from each other so that convex portions of the gate electrode, the channel and the source and drain regions of a transistor face concave portions of the neighboring transistor. Thereby, a plurality of transistors is laid out efficiently.

DETAILED DESCRIPTION OF THE INVENTION

Figure 1:
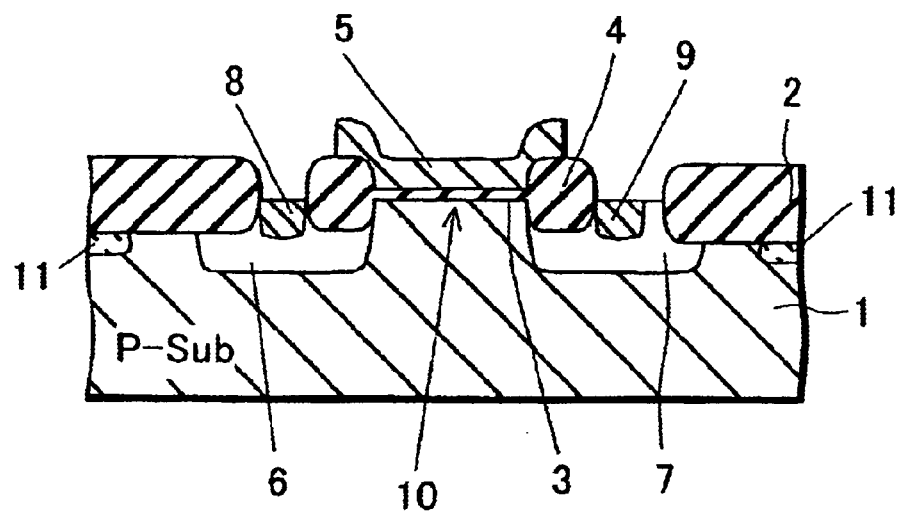
FIG. 1 shows a cross-sectional view of a semiconductor device of an embodiment of the invention.

An embodiment of the invention will be described below referring to the drawings.

Figure 2:
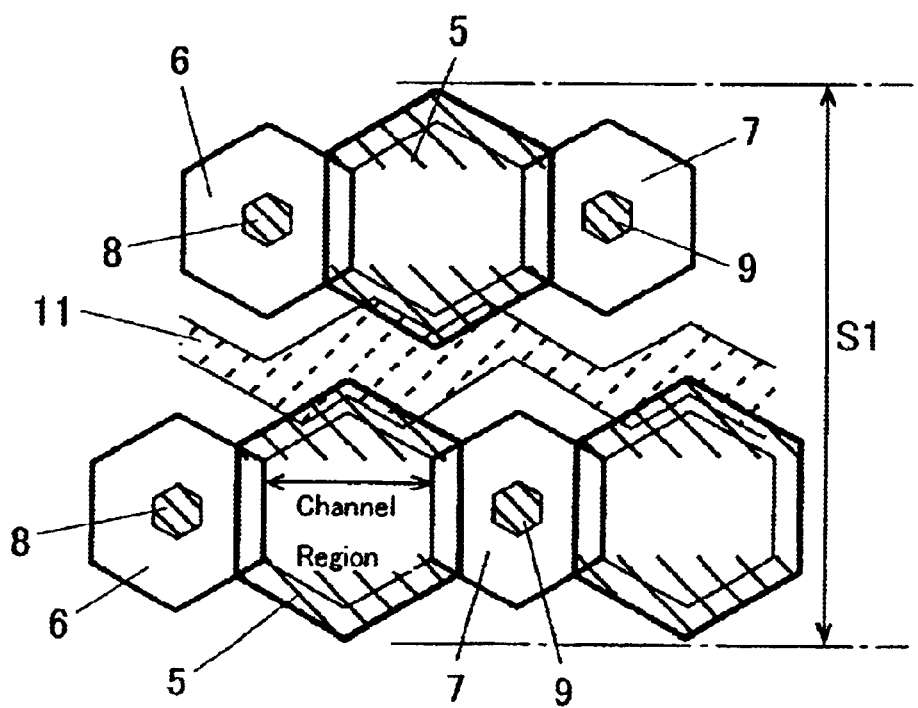
FIG. 2 shows a top view of the semiconductor device of the embodiment of the invention.
Figure 3:
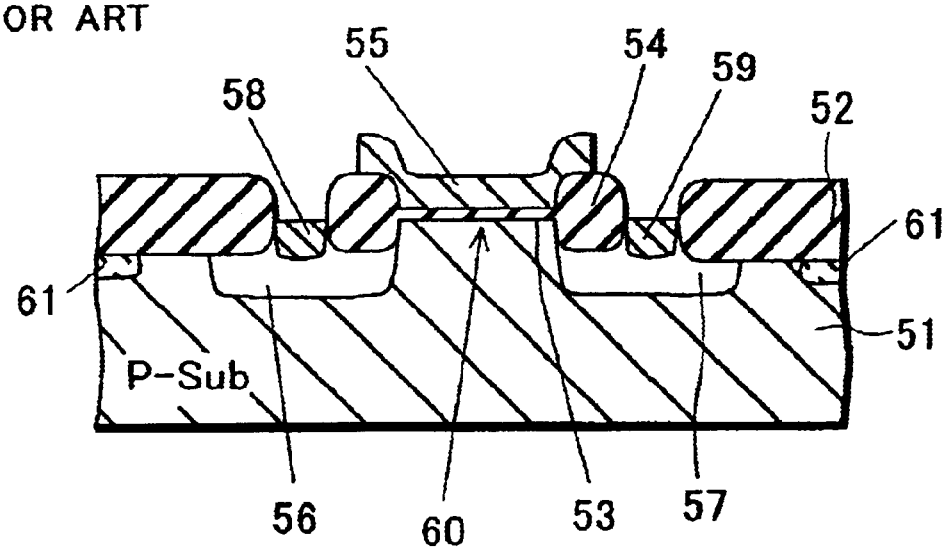
FIG. 3 shows a cross-sectional view of a prior art semiconductor device.
Figure 4:
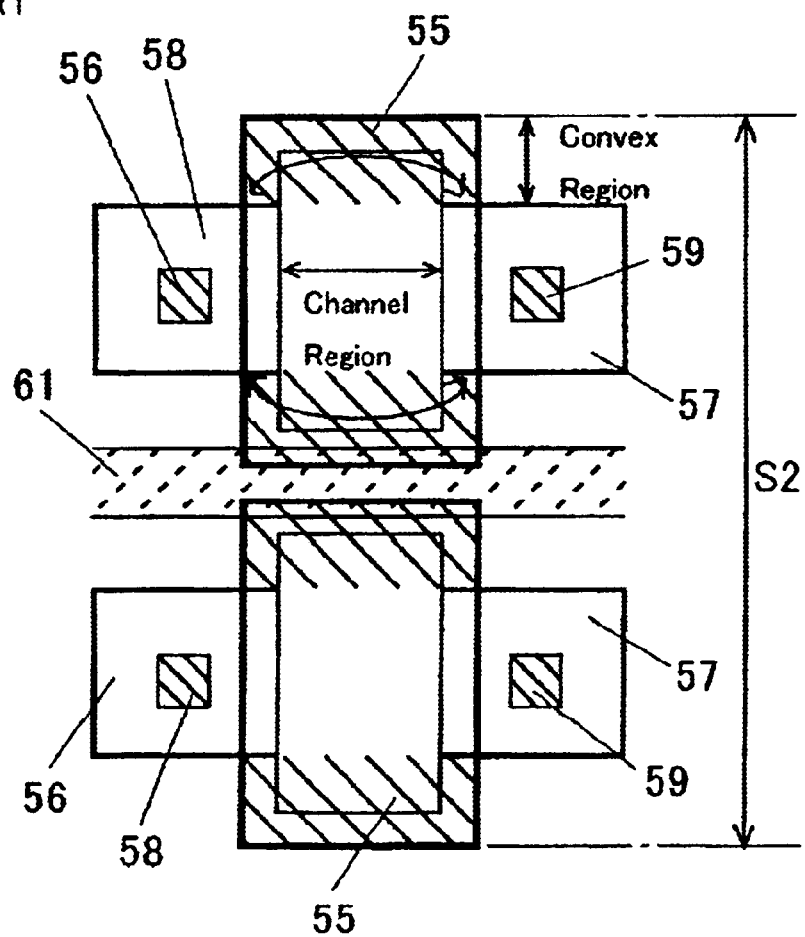
FIG. 4 shows a top view of the prior art semiconductor device.

FIG. 1 and FIG. 2 are a cross-sectional view and a top view illustrating a semiconductor device of the invention.

A gate electrode 5 is disposed on a first gate insulation film 3 and a second gate insulation film 4, which is thicker than the first gate insulation film 3, formed in areas other than areas of a device isolation film 2 on a semiconductor substrate 1 of a first conductivity e.g. P-type, as shown in the figures. The gate electrode 5 is made of polysilicon. The first gate insulation film 3 is preferably made of 44 nm thick $SiO_2$. The second gate insulation film 4 is preferably made of 175 nm thick $SiO_2$. The device isolation film 2 is preferably made of 800 nm thick $SiO_2$. The semiconductor substrate 1 is preferably made of silicon, having an impurity concentration of $1\times10^{15}/cm^3$.

Low impurity concentration N-type source and drain regions (N− layers, drift regions) 6 and 7 are disposed adjacent to the gate electrode 5 through the second gate insulation film 4. An impurity concentration in the N− layers is $1\times10^{17}/cm^3$.

High impurity concentration N-type source and drain regions (N+ layers) 8 and 9 are disposed between the second gate insulation film 4 and the device isolation film 2. An impurity concentration in the N+ layers is $1\times10^{20}/cm^3$.

Together with a channel region 10, which is a surface region of the semiconductor substrate 1 between the source and drain regions 6 and 7 under the first gate insulation film 3, and a channel stopper layer 11 to prevent an inversion, the structure described above makes a so-called LOCOS offset-type semiconductor device.

As shown in FIG. 2, the gate electrode 5, the source and drain regions 6, 7, 8 and 9, and the channel region 10 are polygonal (hexagonal in the embodiment) in shape.

Laying out a plurality of transistors with the least wasted space is made possible by shaping each component of the transistors in a hexagonal form and displacing neighboring transistors from each other. Therefore, the die size can be reduced maintaining essential dimensions such as channel length and drift length (N− layer).

Shaded areas in FIG. 2 correspond to the convex regions in the conventional structure, and suppress leakage current caused by a weak inversion.

By shaping each component of the transistors hexagonal and displacing neighboring transistors from each other, a width S1 of a pair of transistors of this invention is reduced from the width S2 of a pair of transistors in the prior art.

The density of transistors integrated in a die is increased with this invention, leading to reduction in die size.

This invention can be applied not only to the LOCOS offset-type semiconductor device described in the embodiment, but also to semiconductor devices of various other structures.

According to this invention, laying out a plurality of transistors with the least wasted space is made possible by shaping the gate electrodes, the channel regions and the source and drain regions of the transistors are polygonal and displacing neighboring transistors from each other by a predetermined distance.

Therefore, the die size can be reduced while keeping essential dimensions such as channel length and drift length intact.

What is claimed is:

1. A semiconductor device comprising a plurality of transistors, each of the transistors comprising:
   a semiconductor substrate of a first conductivity type;
   a gate insulation film formed on the semiconductor substrate;
   a gate electrode formed on the gate insulation film;
   source and drain regions of a second conductivity type formed adjacent to the gate electrode; and
   a channel region formed between the source and drain regions,
   wherein the gate electrode, the channel region and the source and drain regions are polygonal in shape having more than four sides, and neighboring transistors are displaced from each other by a predetermined distance.

2. A semiconductor device of claim 1, wherein the gate electrode, the channel region and the source and drain regions are hexagonal.

3. A semiconductor device of claim 2, wherein neighboring transistors are displaced from each other so that convex portions of a transistor face concave portions of a neighboring transistor.

4. A semiconductor device comprising a plurality of transistors, each of the transistors comprising:
   a semiconductor substrate of a first conductivity type;
   a gate insulation film formed on the semiconductor substrate;
   a hexagonal gate electrode formed on the gate insulation film;
   a hexagonal source region of a second conductivity type formed on a first side of the hexagonal gate electrode;
   a hexagonal drain region of the second conductivity type formed on a second side of the hexagonal gate electrode opposite to the first side; and
   a hexagonal channel region formed between the hexagonal source and drain regions.

5. A semiconductor device of claim 4, wherein the hexagonal gate electrode shares one side of its hexagonal shape with the hexagonal source region and shares another side of its hexagonal shape with the hexagonal drain region.

6. A semiconductor device of claim 5, wherein a corner of the hexagonal gate electrode of one of the transistors faces an indented portion between the hexagonal gate electrode and the hexagonal source region or the hexagonal drain region of a neighboring transistor.

* * * * *